(12) United States Patent
Romme

(10) Patent No.: US 10,236,835 B2
(45) Date of Patent: Mar. 19, 2019

(54) METHODS AND DEVICES FOR RAMPING A SWITCHED CAPACITOR POWER AMPLIFIER

(71) Applicant: Stichting IMEC Nederland, Eindhoven (NL)

(72) Inventor: Jac Romme, Schiedam (NL)

(73) Assignee: Stichting IMEC Nederland, Eindhoven (NL)

( * ) Notice: Subject to any disclaimer, the term of this patent is extended or adjusted under 35 U.S.C. 154(b) by 16 days.

(21) Appl. No.: 15/633,924

(22) Filed: Jun. 27, 2017

(65) Prior Publication Data

US 2017/0373649 A1 Dec. 28, 2017

(30) Foreign Application Priority Data

Jun. 27, 2016 (EP) .................................... 16176431

(51) Int. Cl.
| | |
|---|---|
| *H03F 3/217* | (2006.01) |
| *H03F 3/00* | (2006.01) |
| *H03F 3/19* | (2006.01) |
| *H03F 3/21* | (2006.01) |
| *H03F 7/04* | (2006.01) |
| *H04B 1/04* | (2006.01) |

(Continued)

(52) U.S. Cl.
CPC ............... *H03F 3/005* (2013.01); *H03F 3/19* (2013.01); *H03F 3/21* (2013.01); *H03F 7/04* (2013.01); *H03F 3/189* (2013.01); *H03F 3/2178* (2013.01); *H03F 3/24* (2013.01); *H03F 2200/114* (2013.01); *H03F 2200/387* (2013.01); *H03F 2200/42* (2013.01); *H03F 2200/451* (2013.01); *H03M 1/804* (2013.01); *H04B 1/04* (2013.01); *H04B 2215/067* (2013.01)

(58) Field of Classification Search
CPC ... H03F 3/005; H03F 3/19; H03F 3/21; H03F 7/04
USPC .............................................. 330/9, 51, 251
See application file for complete search history.

(56) References Cited

U.S. PATENT DOCUMENTS

| | | | |
|---|---|---|---|
| 5,420,807 | A | 5/1995 | Shou et al. |
| 6,249,876 | B1 | 6/2001 | Balakrishnan et al. |

(Continued)

FOREIGN PATENT DOCUMENTS

EP 1 884 036 B1 7/2011

OTHER PUBLICATIONS

Yoo, Sang-Min et al., "A Switched-Capacitor RF Power Amplifier", IEEE Journal of Solid-State Circuits, vol. 46, No. 12, Dec. 2011, pp. 2977-2984.

(Continued)

*Primary Examiner* — Khanh V Nguyen
(74) *Attorney, Agent, or Firm* — McDonnell Boehnen Hulbert & Berghoff LLP

(57) ABSTRACT

A method for ramping a switched capacitor power amplifier is disclosed, where the switched capacitor power amplifier comprises a plurality of capacitors in a capacitor bank, and where a number of the capacitors in the capacitor bank are activated. The method comprises changing the number of capacitors in the capacitor bank that are activated, maintaining the changed number of activated capacitors in the capacitor bank for a period of time, and repeating the changing and maintaining, where a length of the period of time is varied between at least two repetitions of the maintaining.

20 Claims, 4 Drawing Sheets

(51) Int. Cl.
    *H03F 3/189*     (2006.01)
    *H03F 3/24*      (2006.01)
    *H03M 1/80*      (2006.01)

(56) References Cited

U.S. PATENT DOCUMENTS

| | | |
|---|---|---|
| 7,276,962 B1 | 10/2007 | Tomasi |
| 8,019,294 B2 | 9/2011 | Ojanen et al. |
| 9,065,385 B2 | 6/2015 | Gorbachov |
| 9,531,409 B2 * | 12/2016 | Butterfield ............ H03F 1/0205 |
| 2004/0096020 A1 | 5/2004 | Jang et al. |
| 2007/0103137 A1 | 5/2007 | Yang |
| 2007/0190949 A1 | 8/2007 | Mohindra |
| 2008/0024235 A1 | 1/2008 | Chia |
| 2011/0221520 A1 * | 9/2011 | Bales ...................... H03F 3/005 |
| | | 330/51 |
| 2012/0126901 A1 | 5/2012 | Leung et al. |
| 2012/0212197 A1 | 8/2012 | Fayed et al. |
| 2013/0234795 A1 * | 9/2013 | Hur ........................... H03F 1/56 |
| | | 330/251 |
| 2015/0311868 A1 * | 10/2015 | Wan ...................... H03F 1/0233 |
| | | 330/9 |
| 2015/0381401 A1 * | 12/2015 | Butterfield ............ H03F 1/0205 |
| | | 375/295 |

OTHER PUBLICATIONS

European Search Report, European Patent Application No. 16176431.1, dated Nov. 3, 2016, 10 pages.

* cited by examiner

METHODS AND DEVICES FOR RAMPING A SWITCHED CAPACITOR POWER AMPLIFIER

CROSS-REFERENCE TO RELATED APPLICATION

The present application is a non-provisional patent application claiming priority to European Patent Application No. 16176431.1 filed Jun. 27, 2016, the contents of which are hereby incorporated by reference.

TECHNICAL FIELD

The present disclosure relates to a method and a device for ramping a switched capacitor power amplifier.

BACKGROUND

In radio frequency (RF) wireless communication systems, a power amplifier is a component having high impact on power consumption. Therefore, a high efficiency of the power amplifier may be beneficial to conserving energy and increasing battery lifetime.

Constant envelope modulations of RF signals allow power amplifiers to operate at or near saturation levels. This implies that the power amplifiers may be efficiently used, as the modulation scheme may be provided with a low peak-to-average power ratio.

The signals transmitted by radio transmitters should meet electromagnetic interference (EMI) regulations. EMI regulations may differ between different countries, but are used for ensuring that radio signals do not interfere with each other and that transmitters transmitting in authorized bands do not interfere with signals outside the bands for which transmission is authorized.

It would be desirable to provide a RF transmitter having close control of transmitted frequencies and power to meet EMI regulations and, possibly, to adapt to different EMI regulations in different countries, while minimizing energy consumption.

In Sang-Min Yoo et al., "A Switched-Capacitor RF Power Amplifier," IEEE JOURNAL OF SOLID-STATE CIRCUITS, vol. 46, no. 12, pp. 2977-87 (December 2011), a switched-capacitor power amplifier is shown operating on an envelope of a non-constant envelope modulated signal in order to amplify the signal efficiently.

SUMMARY OF THE DISCLOSURE

Example embodiments described herein may provide an improved method and device for generating a radio frequency signal, taking EMI regulations into consideration. In one embodiment, it is an object of the disclosure to handle ramping of a switched capacitor power amplifier (SCPA) when generating a radio frequency signal.

These and other aspects of the disclosure are described herein and defined in the claims.

According to a first aspect of the disclosure, there is provided a method for ramping a switched capacitor power amplifier, wherein the switched capacitor power amplifier comprises a plurality of capacitors in a capacitor bank. The method may include ramping the switched capacitor power amplifier by changing a number of capacitors in the capacitor bank that are activated, maintaining the changed number of activated capacitors in the capacitor bank for a period of time, and repeating the changing and maintaining, wherein a length of the period of time is varied over repetitions of the maintaining.

According to a second aspect of the disclosure, there is provided a device for generating a radio frequency signal. The device may include a switched capacitor power amplifier having a plurality of capacitors in a capacitor bank and a control unit for controlling ramping of the switched capacitor power amplifier. The control unit may be arranged to send a control signal for changing a number of capacitors in the capacitor bank that are activated, maintain the changed number of activated capacitors in the capacitor bank for a period of time, and repeat the sending of the control signal and the maintaining, wherein a length of the period of time is varied over repetitions of the maintaining.

According to the disclosure, a SCPA may be used for generating a radio frequency signal, which may allow for carefully controlling the SCPA in order to comply with EMI regulations. The disclosure is based on a realization that using digital logic of an SCPA, a well-defined ramp-up/down behavior may be created in order to limit the EMI when generating a constant-envelope radio frequency signal. Thus, the signal generated when turning on/off the generation of a radio frequency signal may be controlled in order to comply with EMI regulations.

According to an example embodiment, the SCPA may be used in generating a constant-envelope radio frequency signal. As mentioned, the controlling of ramping of the SCPA may allow for compliance with EMI regulations when a constant-envelope radio frequency signal is to be transmitted.

It is, however, a further insight of the disclosure that example methods and devices may be used not only in generating a constant-envelope radio frequency signal, but also in ramp-up/down when turning on/off the generation of a non-constant envelope signal.

According to the disclosure, the ramping may be performed in a number of steps by repeating the changing of a number of activated capacitors in the capacitor bank and maintaining the changed number of activated capacitors in the capacitor bank for a period of time. The period of time may thus define a time delay between successive steps of changing the number of capacitors being activated. Due to the length of the period of time being varied over repetitions of maintaining, it may be avoided that the steps of changing occur with a consistent periodicity which may result in transmitting strong signals at undesired frequencies. Hence, the EMI of the generated signal may be controlled to be within requirements set by regulations.

In the context of this application, the term "activated" should be construed as the switching the voltage bias of a capacitor. This implies that a voltage to which a capacitor is connected is switched between ground and supply. The switching is performed at an oscillator frequency and, hence, the capacitor being activated contributes to amplifying the power of the generated signal. When a capacitor is activated, switching is maintained such that the capacitor is continuously switched between being connected to ground and connected to a supply. In ramping up or down of the SCPA, the number of activated capacitors may be changed in a number of steps to eventually have a desired number of activated capacitors in the capacitor bank.

According to an example embodiment of the method, the length of the period of time may be varied in accordance with a pseudorandom sequence. Similarly, according to an example embodiment of the device, the control unit may comprise a pseudorandom sequence generating unit, and the length of the period of time may be varied based on a pseudorandom sequence generated by the pseudorandom sequence generating unit.

Varying the length of the period of time by a random sequence implies that a regular periodicity of changing the number of activated capacitors is avoided and, hence, an influence of such periodicity on the EMI of the generated signal may be avoided. Further, by using a pseudorandom sequence, the effect of the plurality of steps of changing the number of activated capacitors on a transmitted signal may be well-controlled.

According to an example embodiment of the device, the control unit may be arranged to control a length of a period of time based on a random variable generated by the pseudorandom sequence generating unit and a clock frequency of the control unit. Since the SCPA may be digitally controlled, the number of capacitors that are activated may be changed each clock cycle. This frequency of changing the number of capacitors may be dithered using the pseudorandom sequence, which allows for controlling the length of the period of time.

According to an example embodiment of the method, the length of the period of time may be given by a product of a random variable and a clock period, wherein the random variable is an integer from 1 to a maximum value. Similarly, this allows for the length of the period of time to be controlled using a control unit having a clock period.

According to an example embodiment of the method, the method may further comprise receiving an input of the maximum value for controlling a ramping time. Thus, the maximum value may be input to a control unit for allowing the ramping of the SCPA to be controlled in real time.

According to another example embodiment of the method, the changing of the number of activated capacitors may comprise changing the number of activated capacitors by a number controlled by a stepping parameter. The stepping parameter may thus control how many capacitors that may become activated or de-activated in each step of changing, which may influence spurious frequencies being generated at each step of changing.

According to another example embodiment of the method, the method may further comprise receiving input parameters for controlling the ramping of the SCPA, where the input parameters are based on one or more regulations of electromagnetic interference. Thus, input parameters may be provided which are adapted to local EMI regulations so that the ramping of the SCPA may be dependent on the regulations that apply in a local area. This implies that the ramping may be adapted to EMI regulations, while maximizing speed of ramping (e.g., the time it takes to fully ramp up/down the SCPA). Thus, if EMI regulations are harsh, the input parameters may control ramping such that the speed is slow while generating weak signals in spurious frequencies, whereas, if EMI regulations are lenient, the input parameters may control ramping such that the speed is relatively fast while generating stronger signals in spurious frequencies (while still meeting the EMI regulations).

According to an example embodiment of the device, the control unit may comprise an interface for receiving an input parameter affecting the control of the ramping of the SCPA. Thus, the control unit may be arranged to be able to receive input parameters for controlling the ramping.

The received input parameter may be at least one parameter selected from the group of a maximum value of a random variable affecting the length of the period of time and a stepping parameter defining the number of capacitors to be changed in a changing step.

According to an example embodiment of the method, the method may further comprise generating a constant-envelope radio frequency signal based on an oscillating signal formed by the switched capacitors. Thus, the signal formed by the switched capacitors may be used for generating a constant-envelope radio frequency signal.

According to an example embodiment of the device, the device may further comprise a transmitter for transmitting a constant-envelope radio frequency signal based on an oscillating signal formed by the switched capacitors. Thus, the transmitter may be arranged in the device such that the constant-envelope radio frequency signal is transmitted.

According to an example embodiment, the transmitted radio frequency signal may be a sub-GHz signal. A radio frequency signal in a sub-GHz frequency, such as in the 900 MHz range, may be used for wireless communication between devices, e.g., in use of the Internet of Things. However, the sub-GHz frequency band is not globally regulated, and EMI regulations may vary depending on the region. Thus, the possibility of the disclosure to adapt ramping of SCPAs to meet local EMI regulations may be especially useful when the transmitted radio frequency signal is in a sub-GHz signal.

According to a third aspect of the disclosure, there is provided a handheld unit for communicating on a wireless local area network, the handheld unit comprising a device according to the second aspect of the disclosure.

Effects and features of this third aspect of the present disclosure are largely analogous to those described above in connection with the first and second aspect of the disclosure. Example embodiments mentioned in relation to the first and second aspects of the present disclosure are largely compatible with the third aspect of the disclosure.

In particular, people may bring handheld units, e.g., mobile phones, when travelling globally. Thus, the handheld unit may from time to time be used for communicating in wireless networks in different countries having different EMI regulations. In this respect, having a handheld unit comprising a device according to the second aspect of the disclosure may allow the handheld unit to adapt the controlling of ramp-up/down of a SCPA to the local EMI regulations and also maximize a ramp-up/down time.

DETAILED DESCRIPTION

The present disclosure will now be described more fully hereinafter with reference to the accompanying drawings, in which example embodiments of the disclosure are shown. This disclosure may, however, be embodied in many different forms and should not be construed as limited to the embodiments set forth herein; rather, these embodiments are provided for thoroughness and completeness, and to fully convey the scope of the disclosure.

Figure 1:
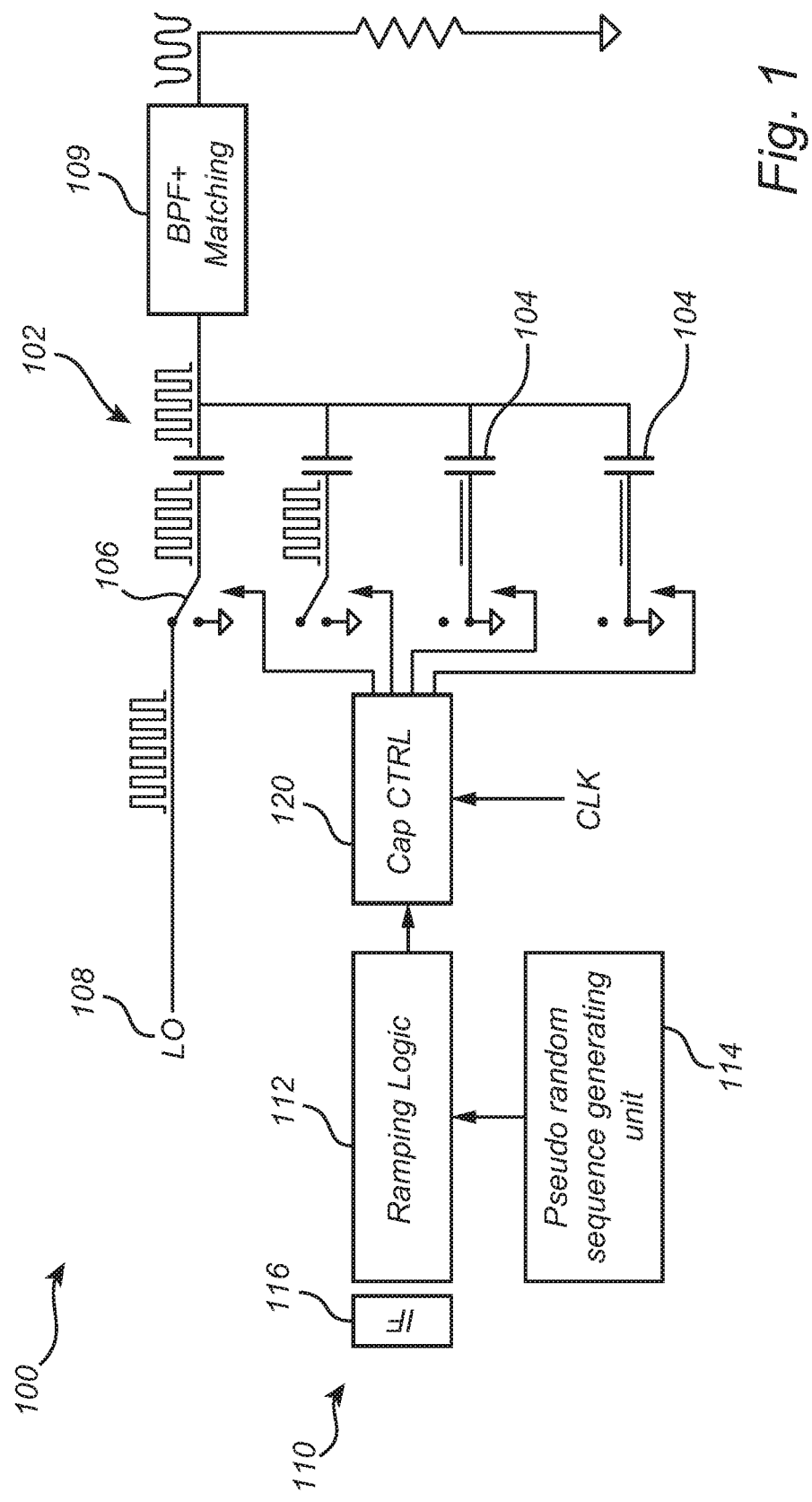
FIG. 1 illustrates a schematic drawing of a device, according to an example embodiment.

Referring now to FIG. 1, a device 100 for generating a radio frequency signal is shown. The device 100 may, for instance, be incorporated into a handheld unit for enabling communication of the handheld unit on a wireless local area network. The handheld unit could be, e.g., a mobile phone or any other device which may be carried by a user. The radio frequency signal generated by the device 100 may be useful for machine-type communication (MTC) and the device 100 may therefore be incorporated into any device that utilizes MTC, such as portable devices or any apparatus, portable or not, that uses wireless communication.

The device 100 may comprise an SCPA 102. The SCPA 102 may comprise a number of capacitors 104 in a capacitor bank. One plate of each capacitor 104 may alternatively be connected to a constant voltage, e.g., ground, or an alternating voltage, which may alternate between ground and a supply voltage with a specific frequency. The capacitor 104 may thus comprise a switch 106 for connecting the capacitor 104 to the constant voltage or the alternating voltage.

The alternating voltage may be provided by a local oscillator (LO) 108 providing a signal having a LO frequency as an input to the capacitor 104. A capacitor 104 is activated when the switch 106 is connected to the alternating voltage.

As mentioned, the SCPA 102 comprises a plurality of capacitors 104 in a capacitor bank. The SCPA 102 provides for digitally controlling an output power by means of changing the number of capacitors 104 that are activated.

The number of activated capacitors 104 may be denoted by n and a total number of activated capacitors 104 in the capacitor bank may be denoted by N. The activated capacitors 104 may together provide a total active capacitance $C_{on} = \Sigma_{i=0}^{n-1} C_i$. The non-activated capacitors are kept connected to ground or supply voltage, such that the total capacitance C, i.e., active plus non-active, remains constant and a resonance frequency will not change. Thus, a square wave at the LO frequency can be generated that is quantized in amplitude in accordance with the total number of capacitors and the total array capacitance. The square wave output by the SCPA 102 may thus alternate between ground and an output voltage, $V_{out}$, given by:

$$V_{out} = \frac{2V_{dd}}{\pi} \frac{C_{on}}{C} = \frac{2V_{dd}}{\pi}\left(\frac{n}{N}\right),$$

where $n \in \{0, 1, \ldots, N\}$ and a maximum output voltage, $V_{max}$, is given by $$V_{max} = \frac{2V_{dd}}{\pi}.$$

The SCPA 102 may output the square wave to a bandpass filter and a matching network 109 for providing a sinusoidal voltage signal, which may provide a carrier signal that may be modulated by a baseband signal comprising the information to be transmitted, before transmitting the modulated signal by a transmitter.

Hence, the SCPA 102 operates like a class-D power amplifier with a capacitive voltage divider in series resonance with a matching network. The output power is given by:

$$P_{out} = 10\log_{10}\left(\frac{4V_{dd}^2}{\pi^2 Z_0}\right) + 20\log_{10}\left(\frac{n}{N}\right)[dBm],$$

where $Z_0$ is an impedance of the matching network 109.

Due to quantization of the amplitude, spurious emissions may occur. As provided below, a control may be provided for ramping of the SCPA 102 when turning on/off such that the spurious emissions are within acceptable limits.

The device 100 thus may further comprise a control unit 110. The control unit 110 may be arranged to send a control signal for controlling the number of capacitors 104 in the capacitor bank that are activated. The control signal may, for instance, be sent to a capacitor control 120, which may be connected to switches 106 for controlling the number of capacitors 104 that are activated.

The control unit 110 may further comprise logic 112 for determining the control signals to be sent in order to provide a desired ramping of the SCPA 102. The control unit 110 may also comprise a pseudorandom sequence generating unit 114, which may provide a pseudorandom sequence. The pseudorandom sequence may be used in controlling ramping of the SCPA 102 as further described below.

The control unit 110 may be implemented as a microprocessor, which may be programmable for controlling operation of the microprocessor. For instance, the processing unit may be a central processing unit (CPU). The processing unit may alternatively be a special-purpose circuitry for providing only specific logical operations. Thus, the processing unit may be provided in the form of an application-specific integrated circuit (ASIC), an application-specific instruction-set processor (ASIP) or a field-programmable gate array.

Local EMI regulations may be defined by authorities in respective countries, such as the Federal Communications Commission (FCC) in the US, the European Telecommunications Standards Institute (ETSI) in Europe, and the Association of Radio Industries and Businesses (ARIB) in Japan. The EMI regulations may differ between different countries and/or localities, and the device 100 may be arranged to meet the local EMI regulations in which it is used.

Thus, the control unit 110 may also comprise an interface 116 for receiving input parameters. The input parameters may be used for controlling the control unit 110 such that the relevant local EMI regulations are met. For instance, the control unit 110 may be adapted to differing EMI regulations if the device 100 is moved between different countries.

The control unit 110 may alternatively be adapted to relevant EMI regulations upon manufacture of the device 100, if it is known where the device 100 will be installed and, hence, which EMI regulations will apply.

In particular, the control unit 110 may control ramping up and down of the SCPA 102 when the SCPA 102 is to be turned on or off. Ramping of the SCPA 102 may be modeled according to the following.

Starting from the model described above, n will be time-variant during ramping. Assuming an infinitely fast switching, the envelope as a function of time e(t) may be denoted by $$e(t) = V_{max}\Sigma_{k=0}^{K-1}(n_k - n_{k-1})u(t-\tau_k),$$

where u(.) denotes the unit-step function. Furthermore, $\tau_k$ and $n_k$ both relate to an event of an envelope change, namely a time of the event and the ratio of number of activated capacitors 104 in relation to the total number N of capacitors after the event. The change of the ratio of number of activated capacitors 104 in the event may be denoted by $a_k$ and is defined as $a_k = n_k - n_{k-1}$. Finally, K denotes the total number of envelope change events. To model a full ramp-up, in the sense that all capacitors 104 are activated in the end, without any ramp-down in a sequence of events, $n_{-1}=0$ and $n_{N-1}=N$. To simplify notation, the envelope can be re-written as $$e(t)=V_{max}a(t)*u(t),$$

with $$a(t) = \sum_{k=0}^{M-1} a_k \delta(t - \tau_k)$$

and $a_k=n_k-n_{k-1}$, such that $\Sigma_{k=0}^{N-1}a_k=1$.

In practice, the SCPA 102 may be controlled using digital logic 112, typically $\tau_k=n_k T_c$ with $T_c$ denoting the clock period of the digital logic 112. Hence, digital control of the SCPA 102 can be described by vector a of which the k-th element $a_k$ describes the power amplifier amplitude change at the k-th clock cycle, where $a_k=0$ correlates with no amplitude change, $a_k>0$ correlates with an amplitude increase, $a_k<0$ correlates with an amplitude decrease, and where $$a(t|a)=\Sigma_{k=0}^{M-1}a_k\delta(t-kT_c).$$

An effect of ramping of the SCPA 102 may be analyzed in relation to how the output signal would be received by an EMI test receiver. Thus, below, an analysis of the signal received by the EMI test receiver is made in order to explain how ramping is implemented.

A finite-duration ramp-up with a constant amplitude increase can be approximated by a sequence of Dirac-pulses if the total ramp-up time is significantly longer than an inverse of a resolution bandwidth of frequencies in an EMI test receiver receiving the signal generated by the device 100. By assuming a sequence of Dirac-pulses with period $T_c$, the ramp-up may be approximated as $$a \sum_{k=-\infty}^{\infty} \delta(t-kT_c) \overset{F}{\leftrightarrow} \frac{a}{T_c} \sum_{k=-\infty}^{\infty} \delta\left(f - \frac{k}{T_c}\right).$$

In other words, the signal becomes a sum of tones separated by $1/T_c$ with amplitude $a/T_c$.

The EMI test receiver may be arranged with a plurality of bandpass filters, each determining a power of the received signal around a frequency $f_0$ expressed as a difference with respect to the LO frequency. In such scenarios, the received signal at each bandpass filter of the EMI test receiver is given by $$y_{f_0}(t) = \frac{-ia}{2\pi} \sum_{k=-\infty}^{\infty} \frac{1}{k} \exp\left(2i\pi \frac{k}{T_c} t\right) G\left(\frac{k}{T_c} - f_0\right),$$

where G is the frequency response of a Gauss filter of the bandpass filter of the EMI test receiver.

Due to the small resolution bandwidth of the bandpass filter of the EMI test receiver compared to the clock rate, for any given observation frequency, at most one tone will pass effectively. Further, due to the 1/k-term, it is evident that a largest side-lobe caused by ramping of the SCPA 102 will occur if $k\in\{-1,1\}$, such that $$|y_{f_{clk}}(t)|^2 = \frac{a^2}{4\pi^2}.$$

It may be noted that the signal strength is independent of t, i.e., the amplitude/envelope is constant. Furthermore, the result is independent of the clock frequency, e.g., lowering the clock frequency will not change the result.

It may now be assumed that $a=2^{-N_b}$, where $N_b$ is the $\log_2$ of the amplitude step-size. Then, the value of largest side-lobe is found at $f_{clk}$, i.e., the clock frequency, with a power equal to $$\max\{|y_{f_c}(t)|^2\}=-6.02N_b-20\log_{10}(2\pi)+13 \text{ [dBm]}=-6.02N_b-2.95 \text{ [dBm]}.$$

Thus, if the ramp-up procedure is long compared to the inverse of the resolution bandwidth, the largest side-lobe can be expected at $f_{clk}$ from the carrier frequency of the transmitter with a power equal to $-6.02N_b-2.95$ [dBm].

Figure 2:
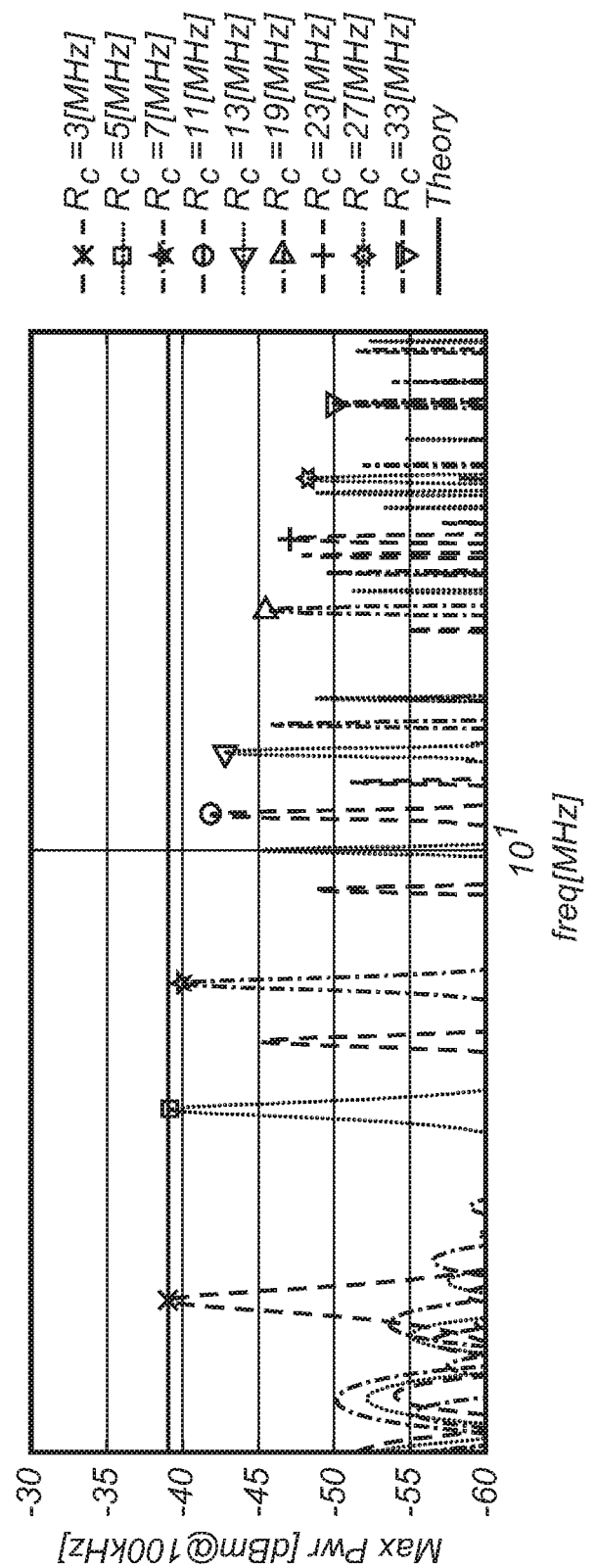
FIG. 2 is a diagram illustrating spurious emissions in ramping of an SCPA, according to an example embodiment.

To illustrate what happens if $(2^{N_b}T_c)$ is of the order of the inverse of the resolution bandwidth, a comparison between the expression of the max-result and simulation results are shown in FIG. 2. In this case, $N_b=6$, and the clock rate is varied.

For visibility reasons, the largest peak side-lobe is marked with an asterisk. In this case, the ramp-up duration equals the inverse of the resolution bandwidth if the clock rate is 6.4 MHz. As expected, if the clock rate $R_c$ is lower than 6.4 MHz, the theoretical model matches well with simulation results. The discrepancy between both increases once the clock rate exceeds 6.4 MHz.

Thus, as shown above, activating additional capacitors 104 each clock cycle will result in temporal regularities and cause spectral spikes. Lowering the clock rate will only affect the frequency of the strongest spectral spike but not its power. Increasing the clock rate can help if it is so large that the matching network 109 suppresses the spikes. In some example embodiments, the matching network 109 is wideband, such that very high clock rates are required to achieve sufficient suppression. Also, this would be at the expense of higher power consumption in the digital domain.

According to the disclosure, a digitally controlled time dithering technique may be used to reduce the power in the first spectral spike without affecting its frequency, at the expense of additional ramp-up time. Instead of activating/deactivating one more/less capacitor 104 each clock cycle during ramp-up/down, a pseudorandom number of clock cycles may pass before activating/deactivating the next capacitor 104. As the average period between power-steps is increased, the power in the spectral spike at the clock frequency is reduced. Furthermore, due to the random nature, spikes may not occur at other frequencies, but may be spread over the whole range between 0 and the clock frequency.

As stated above, the time between two events (of increasing/decreasing the number of active capacitors 104 by one) may be a (pseudo)random number, e.g., $$\tau_{k+1}-\tau_k=r_kT_c,$$

where $r_k$ is a random variable with a natural value with $r_k\in\{1, 2, \ldots, N_r\}$. As a result, the total ramp-up time may be random as well.

Figure 3:
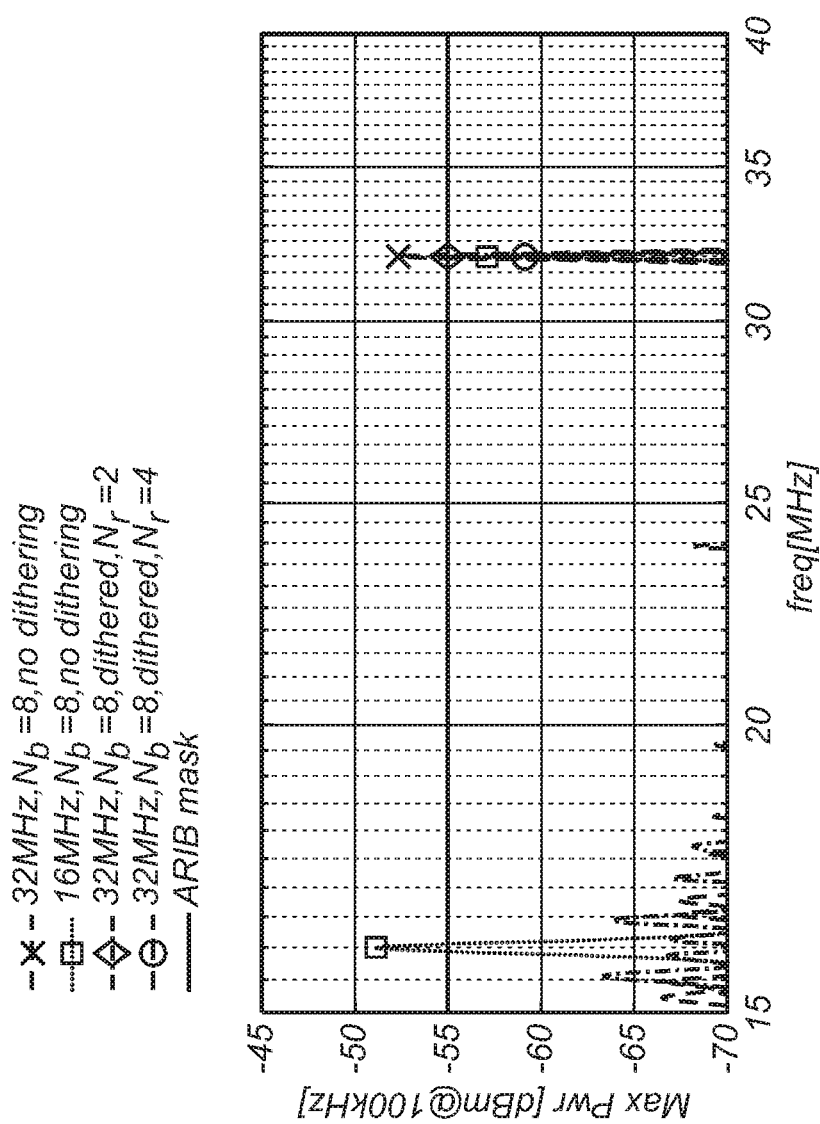
FIG. 3 is a diagram illustrating control of spurious emissions, according to an example embodiment.

In FIG. 3, the resulting spectrum is shown for a random realization with different values of $N_r$. In FIG. 3, ramping using a clock frequency of 16 and 32 MHz, respectively, without dithering is also shown for reference. Additionally, FIG. 3 also illustrates the ARIB mask assuming a carrier frequency of 928 MHz. In this example, $N_b$ is chosen equal to 8, which means that the ARIB mask is violated for both clock rates if no dithering is applied. In FIG. 3, a global maximum given a frequency above 2 MHz is marked with a '+' and a local maximum around 32 Mhz with an 'x', such that if both coincide an asterisk appears. Again, it is shown that decreasing the clock rate does not alter the power in the clock spur. In both dithered cases ($N_r$=2; 4), the spur at the clock frequency is reduced, whereas a lower spur, as expected, is obtained if $N_r$ is 4, at the expense of a total ramp-up time.

The realization of the random sequence of values $r_k$ may be generated pseudorandomly, e.g., using a linear-feedback shift register (LFSR), which can be re-initialized every ramp-up/down, such that conformance with a spectral mask can be achieved.

The control unit 110 may receive as input parameters a stepping parameter defining a step-size of the amplitude, e.g., the number of capacitors 104 to be activated at each event, and/or a maximum value of the random variable, $N_r$. The input parameters may be used to comply with local EMI regulations and may be based on tests of which parameters would allow the ramping of the SCPA 102 to meet specific EMI regulations.

Thus, with harsh requirements, the stepping parameter may be set to 1 and the maximum value of $N_r$ may be large (e.g., 4). With more lenient requirements, the stepping parameter may be increased and/or the maximum value of $N_r$ may be decreased.

According to an example embodiment, a continuous phase modulation (CPM) may be added to a signal output from the SCPA 102 during ramping. The CPM may thus be added to the carrier signal, which may also decrease power of spurs. In particular, this may be achieved if the modulation is such that the modulation bandwidth is of the order of or well above the resolution bandwidth of an EMI test receiver. A trade-off between adjacent/alternate channel power leakage and the ramping spur can be made. In such examples, using CPM may not increase ramping time and can be used in addition to dithering.

Figure 4:
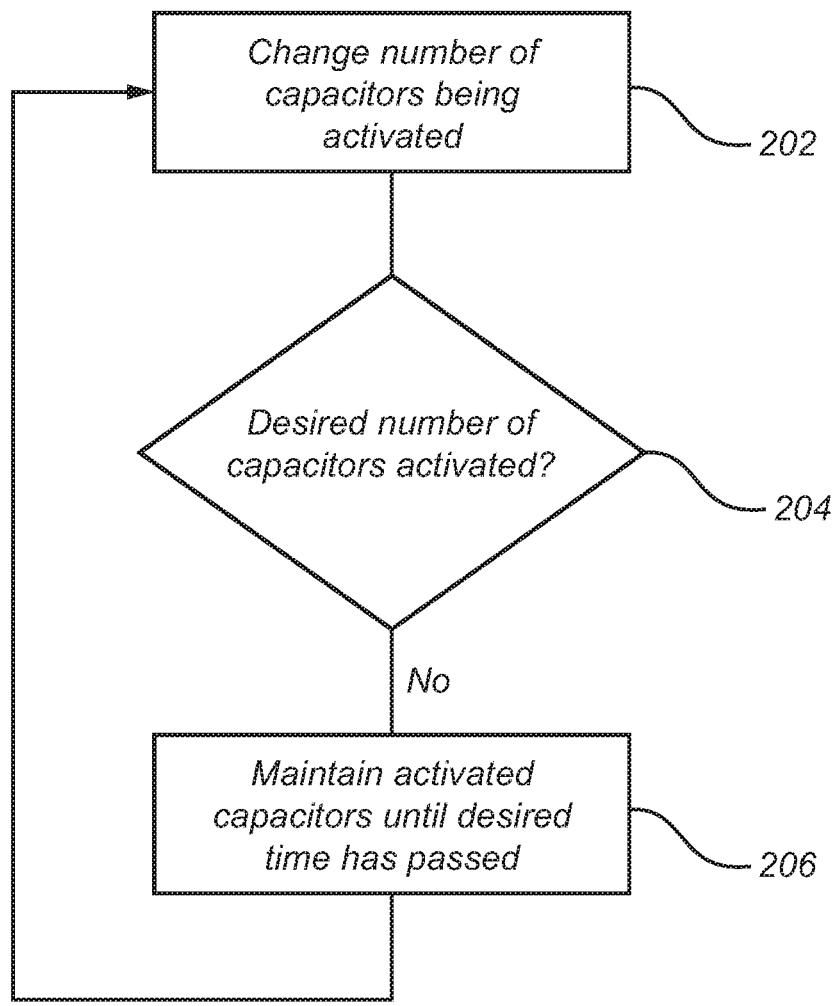
FIG. 4 is a flow chart of a method, according to an example embodiment.

Referring now to FIG. 4, a method for ramping an SCPA 102 will be described. The method may be started upon receiving a trigger that the SCPA 102 is to be ramped up or ramped down, based on a need to turn on or off transmitting of signals by the device 100.

The method may involve, in step 202, changing a number of capacitors 104 being activated by a number set by a stepping parameter. Then, the method may proceed to step 204, which may involve checking whether the desired number of capacitors 104 are activated in the SCPA 102, e.g., whether the SCPA 102 has been ramped to a desired power.

If not, the method may proceed to step 206 for waiting until another event of changing the number of capacitors 104 is to be performed. The next event may be scheduled to occur at an integer number times a clock period. Hence, step 206 may involve checking whether a clock cycle coincided with $r_k T_c$, where $r_k$ may be a random variable such that the period of time between events of changing the number of capacitors 104 may vary. During the waiting that occurs while step 206 checks whether the desired time has passed, the activated capacitors are maintained in an activated state.

When the desired time has passed, the method may return to step 202 in order to again change a number of capacitors 104 being activated. The method may thus continue to repeat the steps 202-206 until the desired number of capacitors 104 are activated and the ramping is completed.

In the above, the disclosure has mainly been described with reference to a limited number of embodiments. However, it will be understood that other embodiments than the ones disclosed above are equally possible within the scope of the disclosure, as defined by the appended claims.

What is claimed is:

1. A method comprising:
ramping a switched capacitor power amplifier, wherein the switched capacitor power amplifier comprises a plurality of capacitors in a capacitor bank, wherein a number of the capacitors in the capacitor bank are activated, an activated capacitor being configured to be repeatedly switched between being connected to ground and connected to a supply, and wherein the ramping comprises:
changing the number of capacitors in the capacitor bank that are activated;
maintaining the changed number of activated capacitors in the capacitor bank for a period of time; and
repeating the changing and maintaining, wherein a length of the period of time is varied between at least two repetitions of the maintaining.

2. The method of claim 1, wherein the length of the period of time is varied in accordance with a pseudorandom sequence.

3. The method of claim 1, wherein the length of the period of time for each repetition of the maintaining is given by a product of a random variable and a clock period, wherein the random variable is an integer ranging from 1 to a maximum value.

4. The method of claim 3, further comprising receiving an input specifying the maximum value.

5. The method of claim 1, further comprising receiving an input specifying a stepping parameter, wherein changing the number of capacitors in the capacitor bank that are activated comprises changing the number of capacitors by the specified stepping parameter.

6. The method of claim 1, further comprising receiving input parameters for controlling the ramping of the switched capacitor power amplifier.

7. The method of claim 1, further comprising using the switched capacitor power amplifier to generate a constant-envelope radio frequency signal.

8. The method of claim 7, further comprising transmitting the generated constant-envelope radio frequency signal.

9. The method of claim 1, wherein changing the number of capacitors in the capacitor bank that are activated comprises increasing the number of capacitors in the capacitor bank that are activated.

10. The method of claim 1, wherein changing the number of capacitors in the capacitor bank that are activated comprises decreasing the number of capacitors in the capacitor bank that are activated.

11. The method of claim 1, wherein repeating the changing and maintaining comprises repeating the changing and maintaining until the number of capacitors in the capacitor bank that are activated is a predefined number.

12. A device for generating a radio frequency signal, the device comprising:
a switched capacitor power amplifier, wherein the switched capacitor power amplifier comprises a plurality of capacitors in a capacitor bank, and wherein a number of the capacitors in the capacitor bank are activated, an activated capacitor being configured to be repeatedly switched between being connected to ground and connected to a supply; and a control unit for controlling ramping of the switched capacitor power amplifier, the control unit being configured to:
  send a control signal to change the number of capacitors in the capacitor bank that are activated;
  maintain the changed number of activated capacitors in the capacitor bank for a period of time; and
  repeat the sending of the control signal and the maintaining, wherein a length of the period of time is varied between at least two repetitions of the maintaining.

13. The device of claim 12, wherein the control unit comprises a pseudorandom sequence generating unit, and wherein the length of the period of time is varied based on a pseudorandom sequence generated by the pseudorandom sequence generating unit.

14. The device of claim 13, wherein the pseudorandom sequence generated by the pseudorandom sequence generating unit comprises a sequence of pseudorandom variables, and wherein control unit is further configured to control the length of the period of time for each repetition of the maintaining based on a product of a clock period of the control unit and a respective pseudorandom variable of the sequence of pseudorandom variables.

15. The device of claim 14, wherein each pseudorandom variable is an integer ranging from 1 to a maximum value.

16. The device of claim 15, wherein the control unit comprises an interface for receiving an input parameter specifying the maximum value.

17. The device of claim 12, wherein the control unit comprises an interface for receiving an input parameter, and wherein the control unit is further configured to use the received input parameter for controlling the ramping of the switched capacitor power amplifier.

18. The device of claim 17, wherein the received input parameter is a stepping parameter, and wherein sending the control signal to change the number of capacitors in the capacitor bank that are activated comprises sending the control signal to increment the number of capacitors in the capacitor bank that are activated by the specified stepping parameter.

19. The device of claim 12, further comprising a transmitter for transmitting a constant-envelope radio frequency signal based on an oscillating signal formed by the switched capacitor power amplifier.

20. A handheld unit for communicating on a wireless network, the handheld unit comprising:
  a switched capacitor power amplifier, wherein the switched capacitor power amplifier comprises a plurality of capacitors in a capacitor bank, and wherein a number of the capacitors in the capacitor bank are activated, an activated capacitor being configured to be repeatedly switched between being connected to ground and connected to a supply; and
  a control unit for controlling ramping of the switched capacitor power amplifier, the control unit being configured to:
    send a control signal to change the number of capacitors in the capacitor bank that are activated;
    maintain the changed number of activated capacitors in the capacitor bank for a period of time; and
    repeat the sending of the control signal and the maintaining, wherein a length of the period of time is varied between at least two repetitions of the maintaining.

* * * * *